(12) United States Patent
Ake

(10) Patent No.: US 7,012,237 B1
(45) Date of Patent: Mar. 14, 2006

(54) MODULATED LASER LIGHT DETECTOR

(75) Inventor: DuWain K. Ake, Beavercreek, OH (US)

(73) Assignee: Apache Technologies, Inc., Dayton, OH (US)

(*) Notice: Subject to any disclaimer, the term of this patent is extended or adjusted under 35 U.S.C. 154(b) by 196 days.

(21) Appl. No.: 10/695,673

(22) Filed: Oct. 29, 2003

(51) Int. Cl.
  *H03F 3/08* (2006.01)
(52) U.S. Cl. .................................... 250/214 A; 356/11
(58) Field of Classification Search ............ 250/214 A, 250/206.1, 206.2; 340/955, 956; 356/5.09, 356/5.11, 5.12
  See application file for complete search history.

(56) References Cited

U.S. PATENT DOCUMENTS

| | | |
|---|---|---|
| 3,017,046 A | 1/1962 | Runci et al. |
| 3,469,919 A | 9/1969 | Zellner |
| 3,708,232 A | 1/1973 | Walsh |
| 3,727,332 A | 4/1973 | Zimmer |
| 3,790,277 A | 2/1974 | Hogan |
| 3,813,171 A | 5/1974 | Teach et al. |
| 3,887,012 A | 6/1975 | Scholl et al. |
| 3,894,230 A | 7/1975 | Rorden et al. |
| 3,900,073 A | 8/1975 | Crum |
| 3,997,071 A | 12/1976 | Teach |
| 4,029,415 A | 6/1977 | Johnson |
| 4,034,490 A | 7/1977 | Teach |
| 4,040,738 A | 8/1977 | Wagner |
| 4,050,171 A | 9/1977 | Teach |
| 4,129,224 A | 12/1978 | Teach |
| 4,162,708 A | 7/1979 | Johnson |
| 4,231,700 A | 11/1980 | Studebaker |
| 4,273,196 A | 6/1981 | Etsusaki et al. |
| 4,393,606 A | 7/1983 | Warnecke |
| 4,413,684 A | 11/1983 | Duncklee |
| 4,477,168 A | 10/1984 | Hosoe |
| 4,491,927 A | 1/1985 | Bachmann et al. |
| 4,535,699 A | 8/1985 | Buhler |
| 4,604,025 A | 8/1986 | Hammoud |
| 4,674,870 A | 6/1987 | Cain et al. |
| 4,676,634 A | 6/1987 | Petersen |
| 4,715,706 A * | 12/1987 | Wang .......................... 356/5.1 |
| 4,726,682 A | 2/1988 | Harms et al. |

(Continued)

FOREIGN PATENT DOCUMENTS

GB         2 101 077 A      1/1983

OTHER PUBLICATIONS

"360 degree Machine Guidance" and "Depthmaster" sales literature, by Laser Alignment, Inc. (exact date unknown, but known to be before Jun. 12, 1989).

(Continued)

*Primary Examiner*—Georgia Epps
*Assistant Examiner*—Kevin Wyatt
(74) *Attorney, Agent, or Firm*—Frederick H. Gribbell

(57) ABSTRACT

A modulated laser light detector that converts laser light energy into electrical signals which exhibit a frequency that is substantially the same as the laser light modulation frequency, in which these signals allow the detector unit to determine a position where the laser light is impacting upon a photodiode array. A synchronous rectifier circuit is provided which, by use of a phase locked loop, converts a full-wave analog signal representative of the modulated laser energy into a half-wave analog signal, which is filtered and demodulated to generate a DC level that is indicative of the strength of the received laser light energy. At least two channels of these signals are used to determine the impacting position of the laser light energy.

15 Claims, 16 Drawing Sheets

U.S. PATENT DOCUMENTS

| | | | |
|---|---|---|---|
| 4,732,471 A | | 3/1988 | Cain et al. |
| 4,743,110 A | * | 5/1988 | Arnaud et al. ............. 356/5.09 |
| 4,756,617 A | | 7/1988 | Cain et al. |
| 4,829,418 A | | 5/1989 | Nielsen et al. |
| 4,884,939 A | | 12/1989 | Nielsen |
| 4,907,874 A | | 3/1990 | Ake |
| 4,912,643 A | | 3/1990 | Beirxe |
| 4,976,538 A | | 12/1990 | Ake |
| 5,082,364 A | * | 1/1992 | Russell ...................... 356/5.15 |
| 5,174,385 A | | 12/1992 | Shinbo et al. |
| 5,343,033 A | | 8/1994 | Cain |
| 5,471,049 A | | 11/1995 | Cain |
| 5,486,690 A | | 1/1996 | Ake |
| 5,528,498 A | | 6/1996 | Scholl |
| 5,682,311 A | | 10/1997 | Clark |
| 5,848,485 A | | 12/1998 | Anderson et al. |
| 5,854,988 A | | 12/1998 | Davidson et al. |
| 5,886,776 A | | 3/1999 | Yost et al. |
| 5,925,085 A | | 7/1999 | Kleimenhagen et al. |
| 5,950,141 A | | 9/1999 | Yamamoto et al. |
| 5,960,378 A | | 9/1999 | Watanabe et al. |
| 6,133,991 A | | 10/2000 | Ake |
| 6,263,595 B1 | | 7/2001 | Ake |

OTHER PUBLICATIONS

"Laserplane Grade-Eye" sales literature, by Spectra-Physics (Oct. 8, 1988).

"Laser Control-Receiver LRE-180/360" sales literature, by MOBA Electronic (exact date unknown, but known to be before Jun. 12, 1989).

"What is a Lock-in Amplifier?" Technical Note TN 1000, by PerkinElmer Instruments (2000).

"Application Note #3 About Lock-In Amplifiers," by PerkinElmer Instruments.

"The Analog Lock-in Amplifier," Technical Note TN 1002, by PerkinElmer Instruments (2000).

"What Is a Lock-In Amplifier?" by Boston Electronics Corporation.

"A Lock-in Amplifier Primer," by Princeton Applied Research (1975).

"Explore the Lock-In Amplifier," by EG&G Princeton Applied Research, Scientific Instrument Group (1983).

* cited by examiner

MODULATED LASER LIGHT DETECTOR

TECHNICAL FIELD

The present invention relates generally to laser light detectors and is particularly directed to laser light detectors of the type which detect modulated laser light energy. The invention is specifically disclosed as a modulated laser light detector that converts laser light energy into electrical signals which exhibit a frequency that is substantially the same as the laser light modulation frequency, and then signal conditions the electrical signals in a manner that allows the detector unit to determine a position where the laser light is impacting upon a photodiode array. A synchronous rectifier circuit is provided which, by use of a phase locked loop, converts a full-wave analog signal representative of the modulated laser energy into a half-wave analog signal, which is filtered and demodulated to generate a DC level that is indicative of the strength of the received laser light energy. At least two channels of these signals are used to determine the impacting position of the laser light energy.

BACKGROUND OF THE INVENTION

Laser alignment systems have been used for years, and some of these systems use a rotating laser light source that periodically sweeps 360°, thereby creating a plane of laser light that can be received and detected by a laser light receiver. Other types of laser alignment systems use a transmitter that projects laser energy continuously in a reference cone, or a reference plane, of light that spreads in all directions about a 360° circle. The range of such detection units, especially when used in direct sunlight, is greatly increased by modulating the laser light source at a predetermined frequency. Such a laser light alignment system using a modulated laser light source is disclosed in U.S. Pat. No. 4,756,617.

In this '617 patent, the laser energy in the alignment field is modulated at 8 kHz, and the signals produced by photodetectors of a laser light receiver are filtered and amplified. A split-cell photodetector is used, thereby producing two input signals that each have a particular strength, depending upon the position of the split-cell photodetector as it is being impacted by the modulated laser energy. After these two input signals are run through individual band pass filters and amplifiers having automatic gain control, the ratio of their signal strengths are compared (by a "ratio comparator" circuit 111) to determine the relative position that the laser light is impacting the photodetector receiver.

The synchronization aspect of the circuit in the '617 patent uses a phase locked loop to generate an internal oscillator signal that exactly matches the phase and frequency of the modulated received signal. The phase locked loop circuitry generates a control signal 136 (see FIG. 4) that feeds a pulse generator 150 (also on FIG. 4). Pulse generator 150 has some built-in time delay, and it outputs a pulse 107 that will occur approximately in the middle of the peak of the "pulse" or pseudo sine/square wave signal that is being received at the photodetectors. (By the time the received input signal comes through the band pass filter with gain, the square wave has been essentially converted into a pseudo sine wave.)

The '617 patent uses an "auto-correlator circuit" as its level detection means for the two channels of signals coming out of the two photodetectors. The auto-correlator uses an analog switch 106a for channel 1, and an analog switch 106b for channel 2. These two analog switches 106a and 106b are controlled by the output signal 107 of the pulse generator 150. When these analog switches 106a and 106b are turned ON (in their conductive state), they will pass the incoming signal from the band pass filter to two resistor-capacitor (RC) filter circuits, 108a and 108b, respectively. The incoming voltage from the band pass filter will charge the capacitors of these RC circuits, and cause the capacitors to be charged to the "peak" voltage of the pseudo sine waves. Then the analog switches are turned OFF, while the incoming waveform is still near its peak voltage, so that the voltage will remain on the capacitors for a certain time interval after the analog switches have been turned OFF. This essentially acts as a synchronous sample and hold circuit.

This auto-correlator approach of the '617 patent exhibits certain problems. One inherent problem is noise on the incoming sine wave. When the voltage waveform is sampled at its peak, any noise (e.g., from ambient light reflections) that occurs at that moment will tend to falsely charge the capacitor over its intended "peak" voltage for that input cycle. Therefore, the capacitor voltage will be incorrect, and this will result in elevation errors, and/or unstable elevation indications. Another inherent problem of this particular circuit design is that the sampled voltage that is placed on the capacitor will discharge over time into the ratio comparator 111. This is clear from the waveform 110 on FIG. 6. Therefore, the actual peak voltage will not be exhibited at the capacitor at the moment the ratio comparator samples the two incoming voltages stored on their respective capacitors on the downstream side of the analog switches 106a and 106b.

One implementation problem with the auto-correlator circuit of the '617 patent is that the analog switches exhibit "charge injection," which causes some spurious charge to flow toward the outputs of these analog switches when they are turned OFF. This thereby charges the "hold" capacitors of the RC filters on the downstream side of the analog switches 106a and 106b. This will, of course, tend to disturb the voltages on the capacitors, which therefore, may not be at the correct magnitudes. Another implementation problem of this auto-correlator circuit is when one of the two input channels has a bias voltage greater than the other. This will be perceived by the auto-correlator as a greater magnitude of the signal of interest, and actually occurs in devices manufactured according to this '617 patent.

It would be an improvement to provide a level detection current that overcomes the inherent problems and implementation problems that are exhibited in the design of the '617 patent, while at the same time being able to detect the relative magnitudes of modulated laser light signals that are received by the photocells of the receiver device.

It is known in the art to use synchronous demodulators or synchronous rectifier circuits in "lock-in amplifiers," which typically are used to extract low amplitude signals that are modulated by a carrier signal in high-noise environments. Many of these lock-in amplifiers are used in laboratory settings, including with laser spectroscopy devices.

SUMMARY OF THE INVENTION

Accordingly, it is an advantage of the present invention to provide a modulated laser light detector that can reliably measure the peak magnitudes of received laser light signals at their respective photocells, and thereby reliably indicate the correct grade or elevation where the laser signal impacts the receiver photocell elements.

It is another advantage of the present invention to provide a modulated laser light receiver that can detect the relative magnitudes or strengths of the laser light impacting at least two photocell elements of the receiver unit, while using a synchronous rectifier circuit having low noise characteristics to more accurately detect the peak values of the laser light signals impacting the photocells.

It is a further advantage of the present invention to provide a modulated laser light detector that uses a synchronous rectifier circuit having low noise characteristics to detect the relative strengths of laser light beams impacting at least two photocells, in which two synchronous rectifiers use multiple-input multiplexers to synchronously control amplifiers having low noise characteristics and will more accurately measure the relative strengths of the incoming signals from the at least two photocells.

It is yet another advantage of the present invention to provide a modulated laser light detector that uses a pair of synchronous rectifier circuits to detect the relative strengths of laser light signals impacting at least two photocells of the receiver unit, while having the ability to use several different photocell arrangements to produce at least two channels of input signals that will be signal conditioned and directed to the synchronous rectifiers.

Additional advantages and other novel features of the invention will be set forth in part in the description that follows and in part will become apparent to those skilled in the art upon examination of the following or may be learned with the practice of the invention.

To achieve the foregoing and other advantages, and in accordance with one aspect of the present invention, a modulated laser light detector is provided, which comprises: (a) at least one laser light photosensor, which generates at least one first electrical signal when receiving modulated laser light energy having at least one predetermined range of wavelengths and at least one predetermined range of modulation frequencies; (b) at least one amplifier stage that receives the at least one first electrical signal and outputs at least one second electrical signal having a first waveform that exhibits voltage components of both positive-going and negative-going regions; (c) a phase and frequency detector that receives the at least one second electrical signal and generates a lock signal that corresponds to a zero crossing of the first waveform; (d) at least one synchronous rectifier stage that receives the lock signal and receives the at least one second electrical signal, and generates at least one third electrical signal of a second waveform that comprises a substantially rectified version of the first waveform; (e) at least one low pass filter that receives the at least one the third electrical signal and outputs at least one fourth electrical signal that comprises a substantially DC voltage; and (f) at least one signal strength detector that inspects the substantially DC voltage of the at least one fourth electrical signal, and determines a relative strength of the received modulated laser light energy.

In accordance with another aspect of the present invention, an electronic circuit is provided, which comprises: (a) a first amplifier stage that outputs a first electrical signal having a first waveform that exhibits voltage components of both positive-going and negative-going regions; (b) a phase and frequency detector that receives the first electrical signal and generates a lock signal that corresponds to a zero crossing of the first waveform; (c) a first synchronous rectifier stage that receives the first electrical signal and generates a second electrical signal of a second waveform, in which the second waveform substantially comprises a rectified version of the first waveform and exhibits a voltage component having substantially only a single one of a positive-going and a negative-going region; and (d) a first low pass filter that receives the second electrical signal and outputs a third electrical signal that comprises a substantially DC voltage.

In accordance with yet another aspect of the present invention, a synchronous rectifier circuit is provided, which comprises: (a) a phase and frequency detector that receives a first electrical signal of a first waveform and generates a lock signal that changes logic states upon a zero crossing of the first waveform, wherein the first waveform exhibits voltage components in both positive-going and negative-going regions; (b) a multiple-input analog signal multiplexer that: (i) receives the first electrical signal at a first input, (ii) receives a virtual ground reference signal at a second input, (iii) receives the lock signal at a control input, and (iv) outputs a second electrical signal that comprises substantially one of: (A) the first electrical signal and (B) the virtual ground reference signal, depending upon the logic state of the lock signal at the control input; and (c) a gain amplifier that receives the second electrical signal, the gain amplifier having an effective voltage gain of substantially +$A_v$ when the lock signal is at a first logic state, and the gain amplifier having an effective voltage gain of substantially -$A_v$ when the lock signal is at a second logic state.

Still other advantages of the present invention will become apparent to those skilled in this art from the following description and drawings wherein there is described and shown a preferred embodiment of this invention in one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description and claims serve to explain the principles of the invention. In the drawings:

DETAILED DESCRIPTION OF THE PREFERRED EMBODIMENT

Reference will now be made in detail to the present preferred embodiment of the invention, an example of which is illustrated in the accompanying drawings, wherein like numerals indicate the same elements throughout the views.

Figure 1:
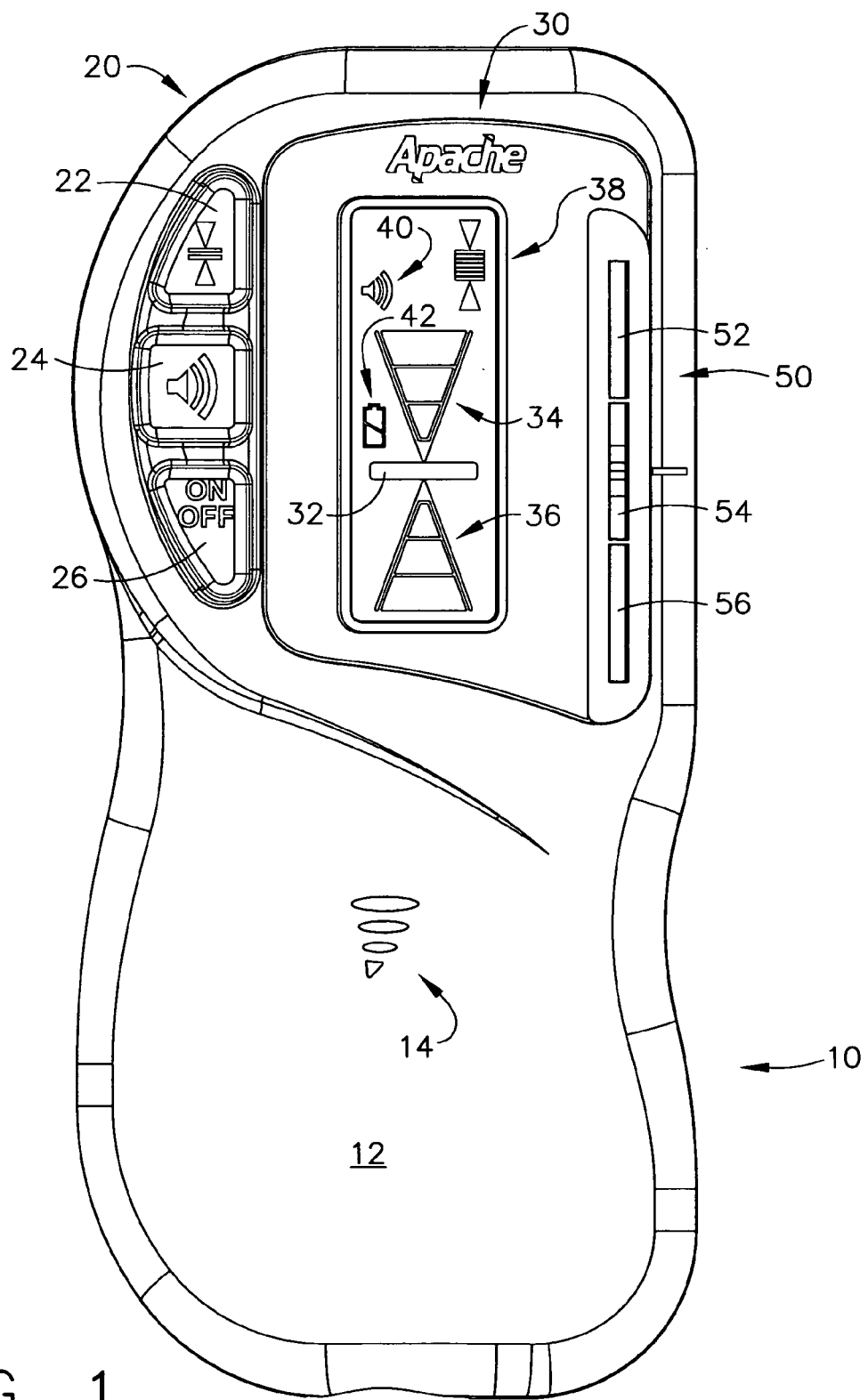
FIG. 1 is a front elevational view of a hand-held modulated laser light detector, as constructed according to the principles of the present invention.

Referring now to FIG. 1, a modulated laser beam detector unit is illustrated, generally designated by the reference numeral 10. Its front outer surface at 12 is typically a plastic molded housing, which has some openings at 14 to allow for an internal beeper or other type of audio output device to be used. A set of pushbutton switches generally designated by the reference numeral 20 are located along the upper left-hand side of the case. These switches are designated by the reference numerals 22, 24, and 26, in which the top switch 22 acts as a dead band control switch, the middle switch 24 enables the beeper (or other type of audio output device) to be activated, and the bottom switch 26 is the unit's ON-OFF switch.

The modulated laser beam detector 10 also includes a liquid crystal display, generally designated by the reference numeral 30. On this LCD display 30 there are several symbols that provide information to the user. The "grade" symbols are designated at the reference numerals 32, 34, and 36, in which the middle symbol 32 would be energized when the laser beam detector 10 is positioned "ON-GRADE" with respect to the plane of light being emitted by a modulated laser light source (not shown). The LCD "arrowhead" triangular-shaped indicators 34 and 36 are, respectively, indicators of above-grade and below-grade. In the illustrated embodiment of the laser detector 10, there are three different above-grade indicators and three different below-grade indicators, thereby providing the user with an indication as to how close or how far the detector 10 is from being on-grade.

A battery symbol at 42 is illustrated on the LCD display 30, which will be visible when the battery that powers the unit 10 has been depleted past a predetermined point. The "speaker" symbol 40 is also part of the LCD display 30, which is visible when the beeper (or speaker) has been enabled (by pushing the button 24). The symbol at 38 on the LCD 30 provides an indication as to the width for the dead band setting.

On FIG. 1, the modulated laser beam detector 10 includes a set of photodetectors, generally designated by the reference numeral 50. In an exemplary embodiment, these photodetectors comprise multiple photocells, such as photodiodes, and they are arranged in a vertical line (as seen in FIG. 1), in which the upper photodiode is at 52, the bottom photodiode is at 56, and the middle photodiode is at 54. The photodiodes in this array are used to intercept the plane of laser light being emitted by the laser light source (not shown), and these photodiodes can output an electrical current, and they are used in the electronic control circuit of the receiving device 10 in a manner that is described in a schematic diagram that starts on FIG. 6. As can be seen in FIG. 1, the middle photodiode 54 is actually comprised of six different photocell sections, each of which represents a separate electrical component, and which are also illustrated on the schematic diagram of FIG. 6.

In this patent document, the terms "photocell" and "photodiode" both refer to an optoelectronic device that produces some form of an electric signal when optical energy impacts such optoelectronic device. A photodiode is a type of photocell, which is a more generic term. The type of electrical signal produced by a photocell need not necessarily be independently sourced to the photocell itself. For example, if a photocell merely changes electrical resistance, then it would not by itself produce an electrical signal. However, if a bias current or a bias voltage is applied to such a resistance-sensitive photocell, then it truly would become an optoelectronic device of the type that could be used in the present invention.

It will be understood that the photodetectors 50 do not necessarily need to consist of photodiodes. Other types of photosensitive components could be used, including phototransistors and photovoltaic cells, which can be considered equivalents to photodiodes for use in the present invention. Essentially any type of optoelectronic component could be used in the present invention, so long as it is "sensitive" to electromagnetic radiation (i.e., such that it will vary its resistance, its current output, or its voltage output as it receives a varying quantity of photons). Such optoelectronic devices do not necessarily have to exhibit a linear response to the received electromagnetic radiation, although such a linear response is generally helpful when determining the strength of the optical energy (i.e., electromagnetic radiation) being received. It will also be understood that the photodetectors 50 do not necessarily have to be particularly sensitive to collimated light in situations where the present invention may be used to detect non-laser light sources. However, for most commercial applications of the present invention, a laser light source is generally preferred, and the photodetectors 50 would typically be designed to be sensitive to such laser energy.

Figure 2:
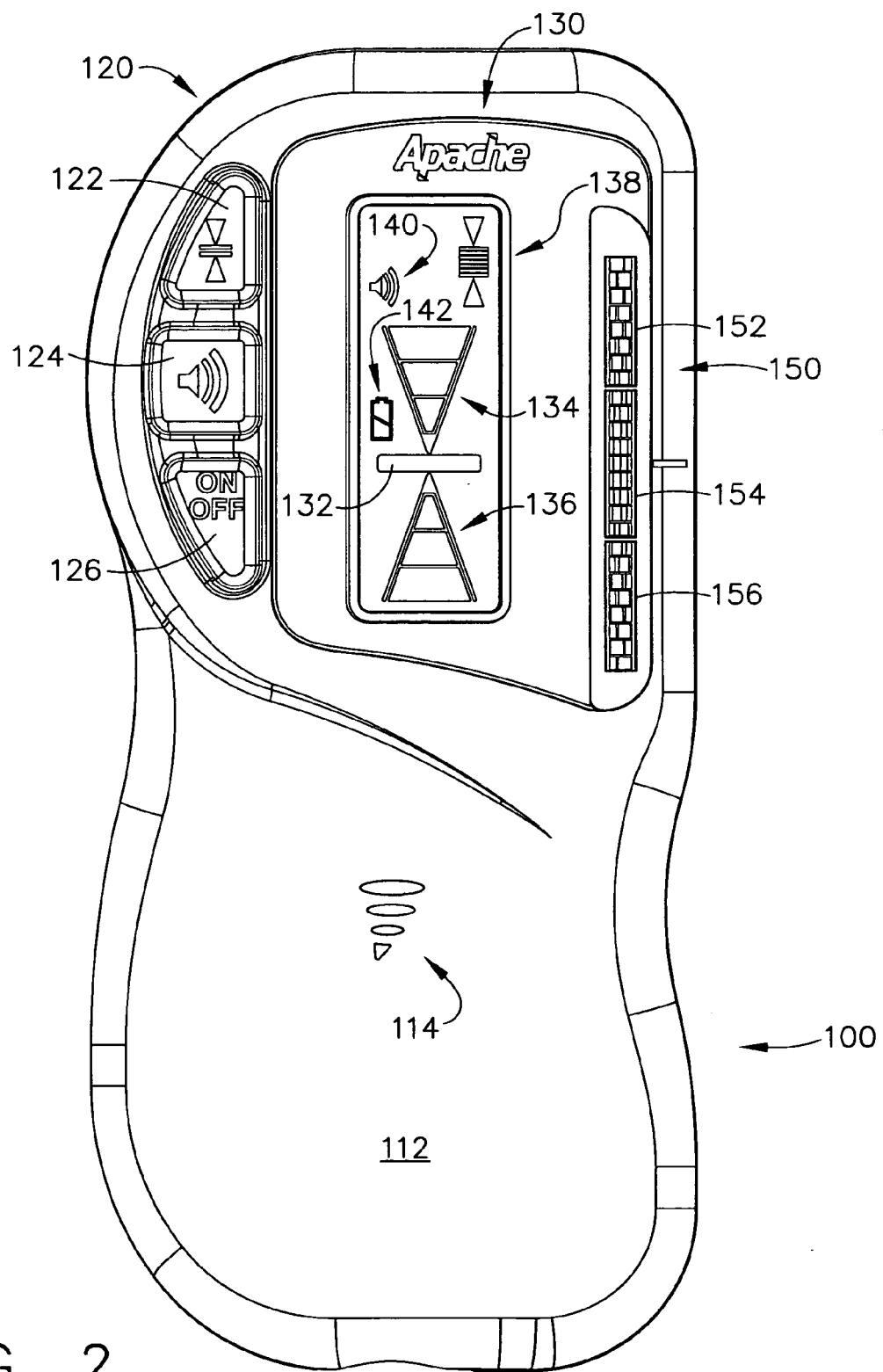
FIG. 2 is another front view of an alternative embodiment for a hand-held modulated laser beam detector, in which an alternative photodiode array is constructed of a number of individual photocell segments.

Referring now to FIG. 2, an alternative embodiment for a modulated laser beam detector is illustrated, generally designated by the reference numeral 100. This photodetector includes a front outer case at 112, and a set of holes for a speaker or beeper at 114. There is also an array of pushbuttons at 120, a liquid crystal display at 130, and an array of photodetectors at 150. The pushbutton switches 122, 124, and 126 have essentially the same functions as the similar switches 22, 24, and 26 that were found on the device 10 illustrated in FIG. 1. The LCD display 130 also has similar capabilities and symbols, including the grade symbols 132, 134, and 136, the low battery symbol 142, the speaker enabled symbol 140, and the dead band status symbol 138.

The main difference between this second embodiment 100 and the first embodiment 10 is the actual photodiode array 150. As can be seen by inspecting FIG. 2, there are again three major photodiode sections at 152, 154, and 156. However, each of these individual photodiode sections is broken into many small photocell segments, which provides for a more accurate laser receiver that can reduce shading effects of the photocells. The principles of this type of photocell design are disclosed in detail in U.S. Pat. No. 6,133,991, titled MULTI-SEGMENT COMPOSITE PHOTOCELL DEVICE, which is commonly assigned to Apache Technologies, Inc. of Dayton, Ohio.

Figure 3:
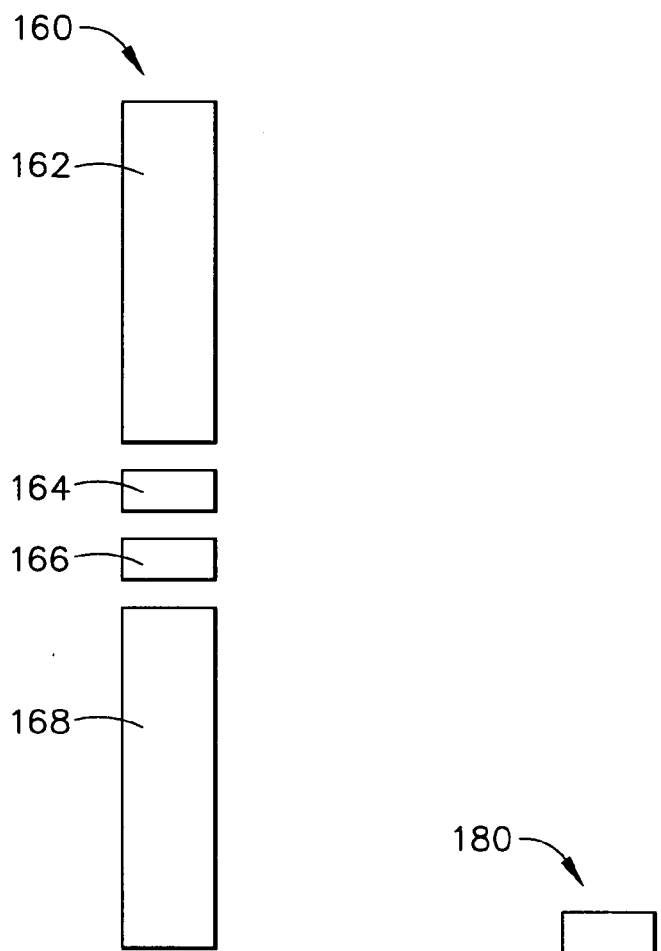
FIG. 3 is a diagrammatic view of another alternative type of photodiode array, having two large cells and two middle small cells, usable with the present invention.

The different types of photocell arrangements of the embodiments 10 and 100 are merely possible examples for use with the electronics of the present invention. Other example photocell array patterns are disclosed on FIGS. 3, 4, and 5. Referring now to FIG. 3, a four-segment photocell array is illustrated, generally designated by the reference numeral 160. The top photocell is 162, the bottom photocell is 168, and there are two "middle" photocells 164 and 166. This type of photocell configuration has been disclosed in U.S. Pat. No. 5,486,690, titled METHOD AND APPARATUS FOR DETECTING LASER LIGHT, which is commonly assigned to Apache Technologies, Inc. of Dayton, Ohio.

Figure 4:
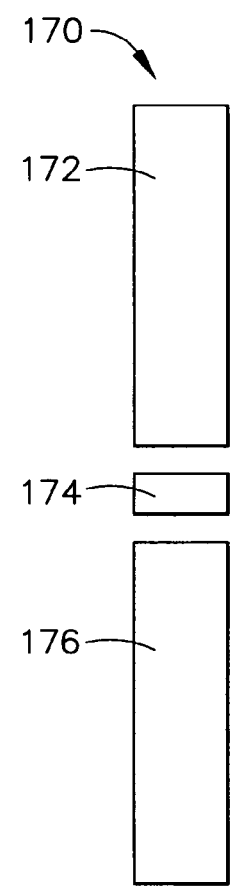
FIG. 4 is a diagrammatic view of yet another alternative photodiode array, having two large cells and one middle small cell, usable with the present invention.
Figure 5:
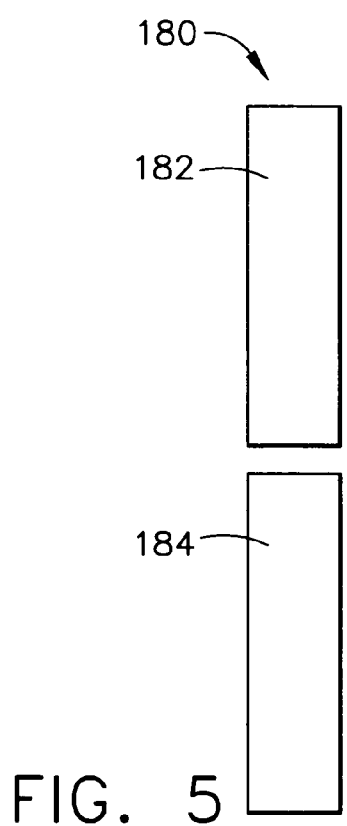
FIG. 5 is a diagrammatic view of a set of two photocells, in which there are two large cells with no intermediate smaller cell, usable with the present invention.

Referring now to FIG. 4, a three-segment photocell array is generally designated by the reference numeral 170, which has a top photocell 172, a bottom photocell 176, and a smaller middle photocell 174. As another example of the flexibility of the present invention, the photocell array 180 of FIG. 5 only includes two fairly large photocell segments, at 182 and 184. In this design, there are no smaller "mid-cells."

Figure 6:
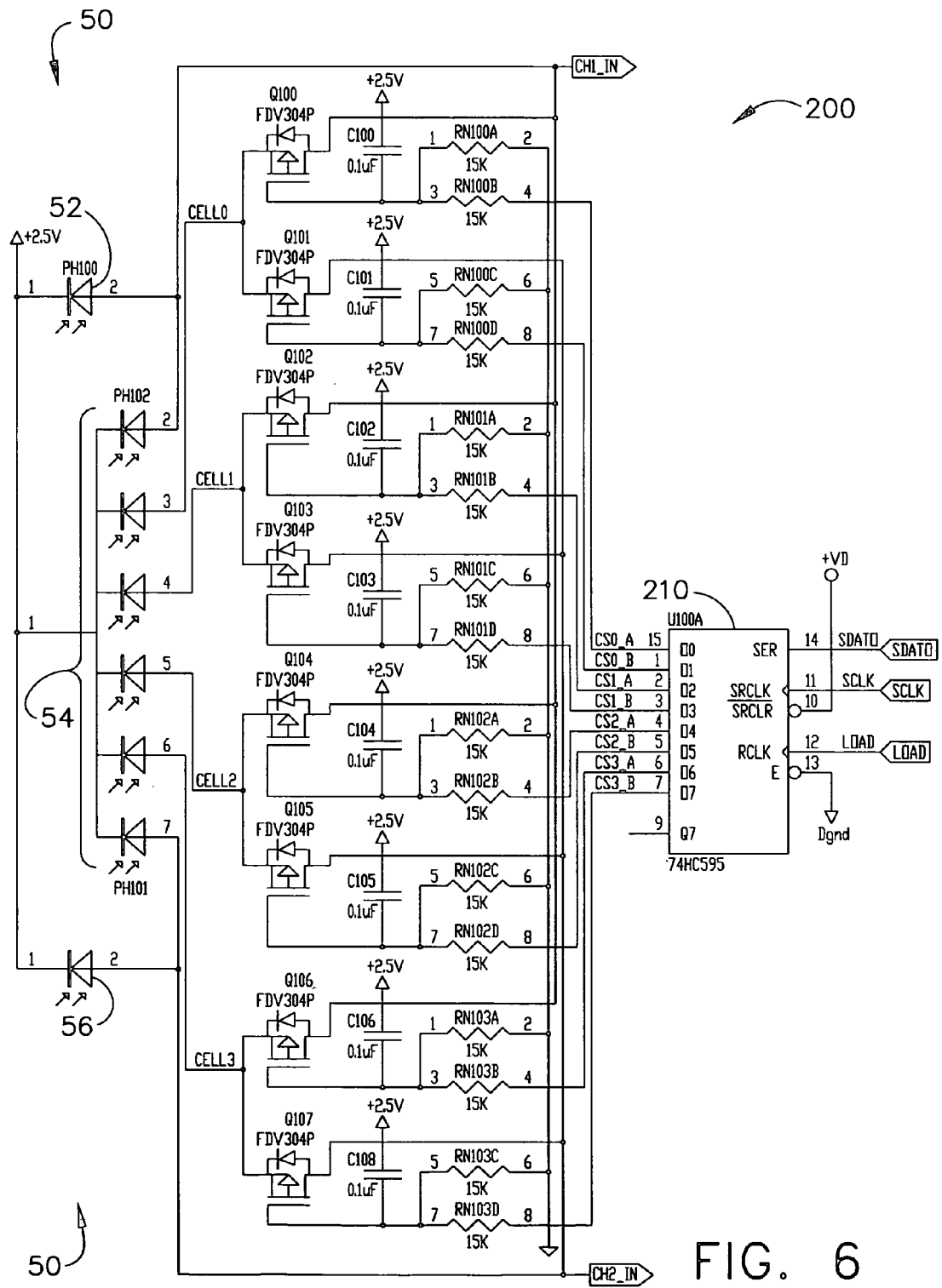
FIGS. 6–17 are an electrical schematic diagram of a portion of the electrical circuit used in the modulated beam detector of FIG. 1.

FIGS. 6–17 illustrate a rather complex electrical schematic diagram, starting on FIG. 6. The input photocells are illustrated along the left-hand side of FIG. 6, and these photocells (e.g., photodiodes) as a single array are generally designated by the reference numeral 50. On FIG. 6, there are two "outer" photocells at 52 and 56, and also a set of six individual photocells that act as the "middle" photocell 54, as seen on FIG. 1. There is a set of analog switches, generally designated by the reference numeral 200, that receives the input signals from some of the middle photocells 54. These analog switches are controlled by a memory gate integrated circuit 210, which periodically turns on each of the analog switches, so that their input signals can be properly apportioned to a "channel 1" signal and a "channel 2" signal, which in turn provides an indication as to the position, or level, that the laser light is striking the photocell array 50.

Figure 7:
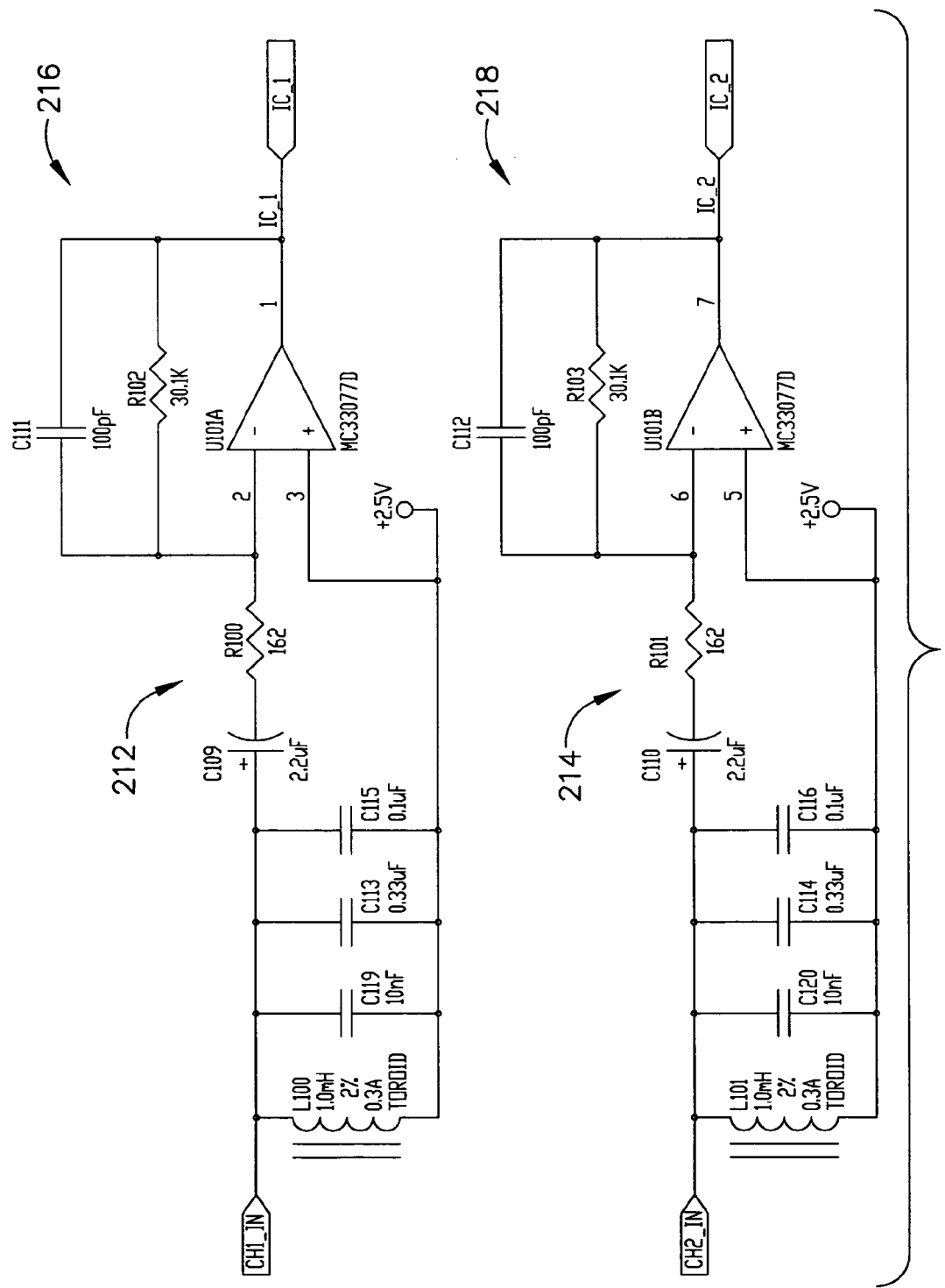

The electrical signals that are output from the analog switches are split into channel 1 and channel 2 signals, as noted above, and these are then directed to two band pass filters 212 and 214, illustrated on FIG. 7. The outputs of these band pass filters 212 and 214 are directed to a set of low noise amplifiers at 216 and 218, respectively, which also are depicted on FIG. 7. The output signals from the low noise amplifiers 216 and 218 typically have an output (or transfer) impedance of about 26.7 kOhms, and a maximum output voltage amplitude of about 420 mV peak to peak, under conditions where laser light is striking the photodiode array 50.

Figure 9:
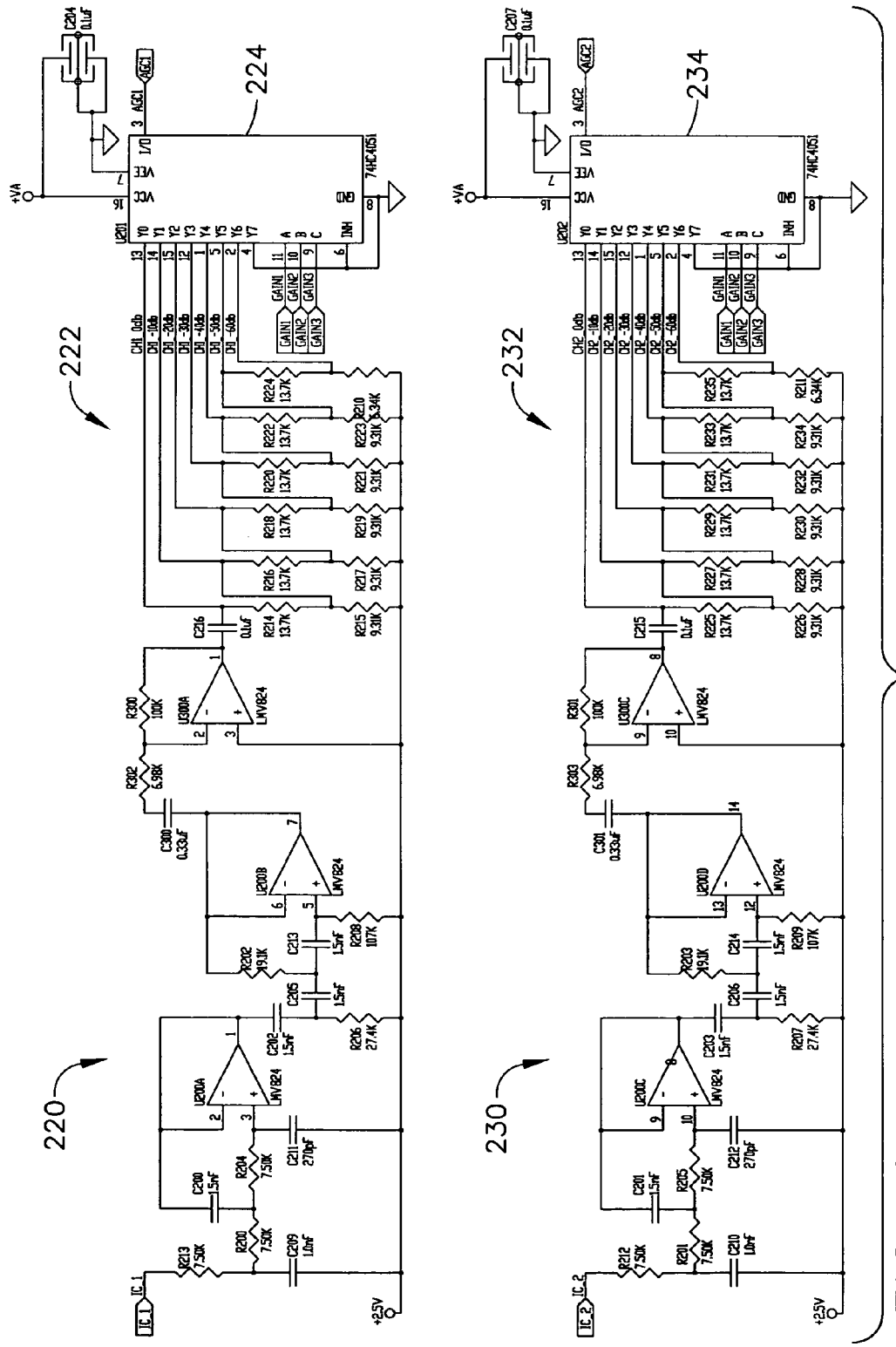

The output signals from the low noise amplifiers 216 and 218 are respectively directed to another set of band pass filters at 220 and 230, as illustrated on FIG. 9. The outputs of these two band pass filters are directed to automatic gain control circuits 222 and 232, respectively. For channel 1, the band pass filter 220 also acts as a gain amplifier, and the gain is dependent upon the multiplexer setting of a multiplexer 224, which decides which set of resistor values to switch in as part of the automatic gain control circuit 222. A similar multiplexer 234 is used to switch in the appropriate resistors 232 for the channel 2 automatic gain control circuit that act as part of the band pass filter and gain amplifier combination 230.

In the illustrated circuit, the overall gain of the two first stages of the band pass filter 220 is about 0.8. The band pass filter 220 actually includes a 3-pole Bessel low pass filter stage, and a 3-pole Bessel high pass filter stage. In the illustrated embodiment, the voltage gain for each of these Bessel filters is 0.9, the low pass filter corner frequency is about 20 kHz, and for the high pass filter stage the corner frequency is about 3.9 kHz. When including the next amplifier stage, which provides a voltage gain of about 14.3, it will provide a 5 volt peak-to-peak maximum voltage at its output stage. These voltage measurements again depend upon the occurrence of laser light energy striking the photodiodes in the array of photodiodes 50.

Figure 10:
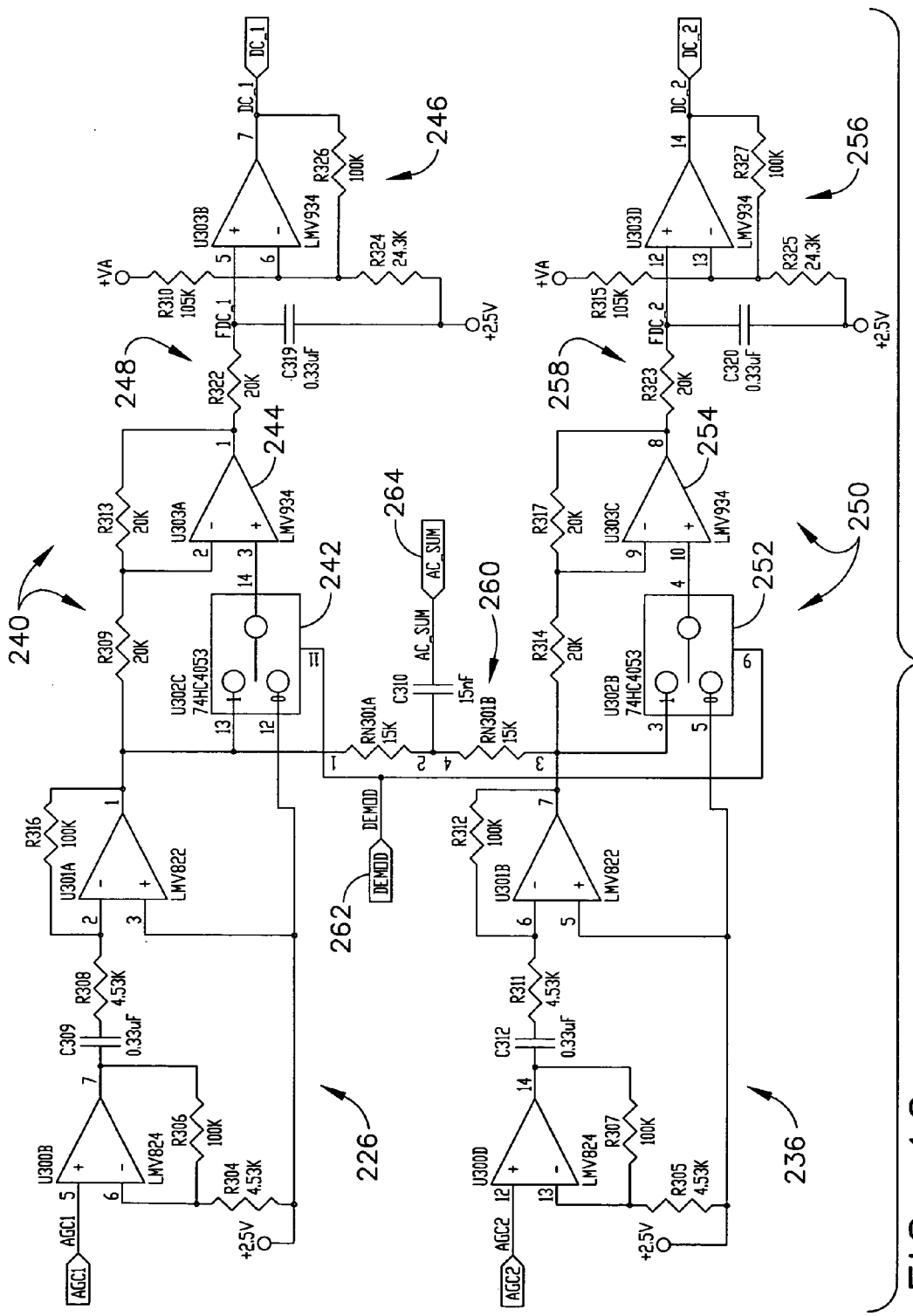

The automatic gain control circuit continues on to the next drawing, FIG. 10, in which two further amplifier stages 226 are used to provide a voltage gain of about 510. The first amplifier stage in the illustrated embodiment provides a voltage gain of about 23.1, while the second amplifier stage provides a gain of about 22.1. The output voltage will be about 0.79 volts peak-to-peak, if a minimum signal of 1.58 mV peak—peak voltage is input to this portion of the automatic gain control amplifier 226. A similar set of amplifier components is found at 236 for channel 2. The gain bandwidth characteristics for the channel 2 filter and gain amplifier 230 are about the same as for the circuit 220.

The outputs of the gain amplifiers 226 and 236 are directed into a pair of synchronous rectifiers 240 and 250, respectively. For the channel 1 rectifier 240, there is a two-input analog multiplexer at 242, which sends its output signal to a gain amplifier 244. The multiplexer 242 is controlled by a signal "DEMOD" along a signal pathway 262, which controls which of the two inputs will be sent through to the output of the multiplexer 242 and into the positive input of the operational amplifier 244. The output signal of the op-amp 244 is then directed into another low pass filter 248 with a gain amplifier at 246.

The DEMOD control signal 262 nominally consists of a square wave that is output from a phase locked loop, which is described below. When the DEMOD signal 262 is in its Logic 1 state, then the op-amp 244 acts as a voltage follower, thus having a designed optimal voltage gain of +1. When the DEMOD signal 262 is at its Logic 0 level, then a reference voltage level that is equal to about one-half of the power supply rail for these amplifiers is sent through the multiplexer 242 to the positive input of the op-amp 244. Since the power supply rails for the op-amp 244 are at +5 volts DC and ground in this exemplary circuit, the reference voltage is at about 2.5 volts DC, and acts as a virtual ground for this op-amp stage. In this circuit, the two resistors RN 300A and RN 300B, by virtue of being substantially equal in resistance value, will make op-amp 244 into a gain amplifier having a designed optimal voltage gain of −1.

The overall effect of this circuit 240 is to act as a synchronous low noise rectifier and, by switching the state of the DEMOD signal in sync with the zero-crossings of the sinusoidal or "near-sine" wave output from the band pass filters 220 and 230, the sinusoidal wave that is output by the gain amplifier 226 is synchronously rectified so that the output signal from the op-amp 244 exhibits a half wave peak-to-peak voltage that is approximately one-half of the peak-to-peak voltage of the full sinusoidal wave that travels through the multiplexer 242 from amplifier 226. Since this sinusoidal wave is now rectified, there are twice as many positive-going one-half "sine" waves in the positive quadrant, and there will be virtually no negative quadrant "sine" wave voltages at the output of the synchronous rectifier circuit 240. The output from the op-amp 244 is directed to another low pass filter 248 with a gain amplifier circuit 246, which essentially demodulates the rectified "half-sine" wave into a DC voltage, having a magnitude that is related to the strength of the laser light energy received at the photocells.

A similar set of amplifiers at 236 receives a signal for channel 2, and the output of this amplifier 236 drives into another two-input multiplexer 252 and another gain amplifier (or op-amp) 254. These are some of the major components of the second synchronous rectifier, generally designated by the reference numeral 250. The output from the op-amp 254 is directed to another low pass filter 258 with a gain amplifier circuit 256, which also essentially demodulates the rectified "half-sine" wave into a DC voltage, and exhibits a magnitude that is related to the strength of the laser light energy received at the photocells.

The two "sine" waves that come into the synchronous rectifiers 240 and 250 are also directed to a summing circuit 260. These signals travel through a set of resistors and a capacitor, before being sent as a "summed AC" signal 264 to a phase locked loop circuit, which will be described immediately below.

Figure 11:
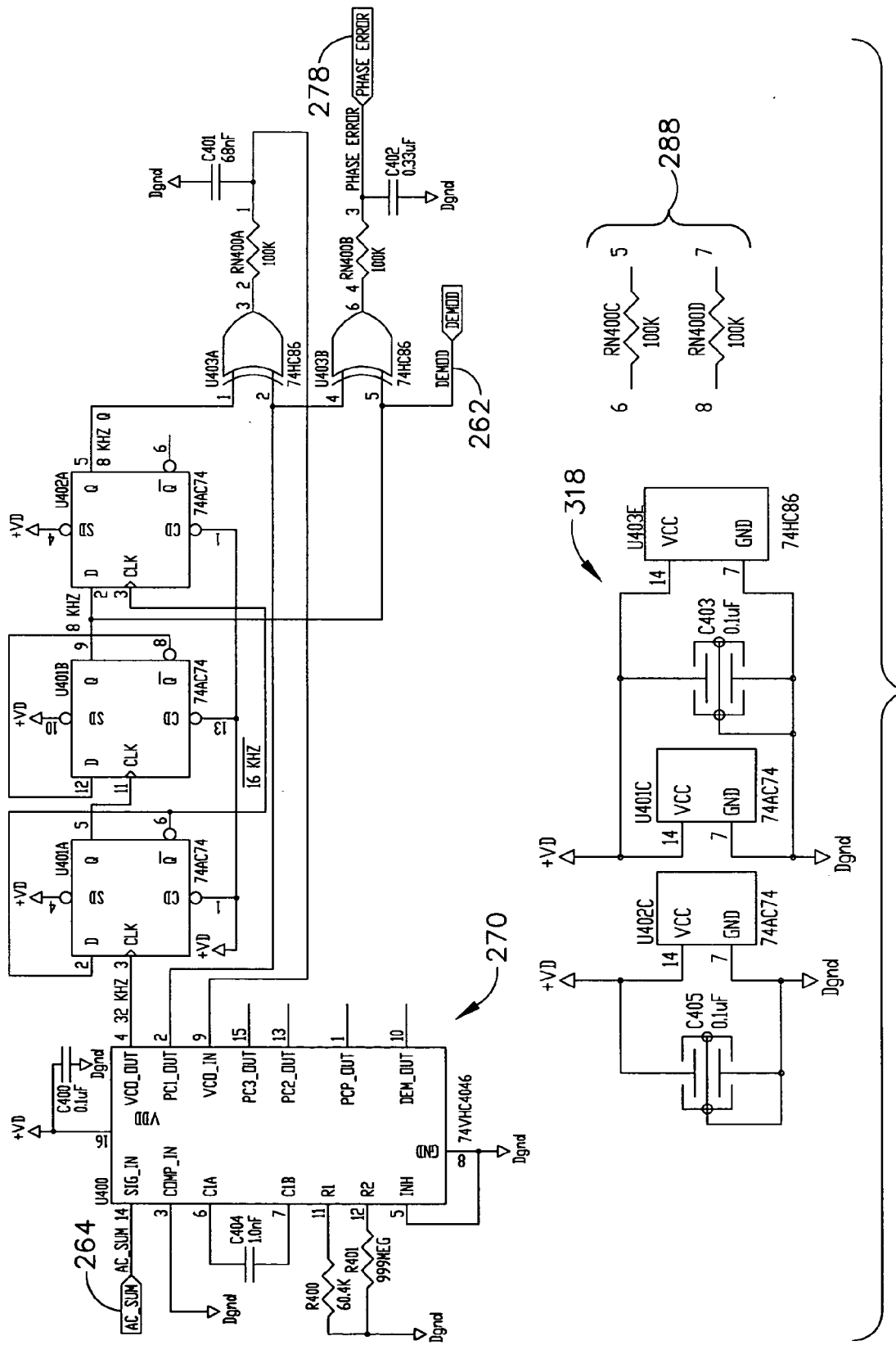

A phase locked loop circuit (PLL) and a "lock detect" circuit are illustrated on FIG. 11, and are generally designated by the reference numeral 270. The summed AC signal 264 is used to provide information to the phase locked loop, and this AC-SUM signal 264 will provide some type of AC waveform if either one of the channels is outputting a voltage, regardless as to which exact set of photodiodes in the array 50 are being impacted by the modulated laser beam. The phase locked loop 270 is utilized to determine if the proper modulated signal is being received at the photodiode array 50, and if so, attempts to bring the overall receiver circuit of the detector 10 into a synchronous lock situation with the incoming modulated laser beam signal. A phase error signal 278 is output from the PLL circuit 270, and this phase error signal 278 is input to a microprocessor that is discussed below, and is used to indicate that the PLL has achieved a "lock" state. The PLL circuit 270 also creates the DEMOD signal 262 that is used to control the two multiplexers 242 and 252, discussed above.

Figure 12:
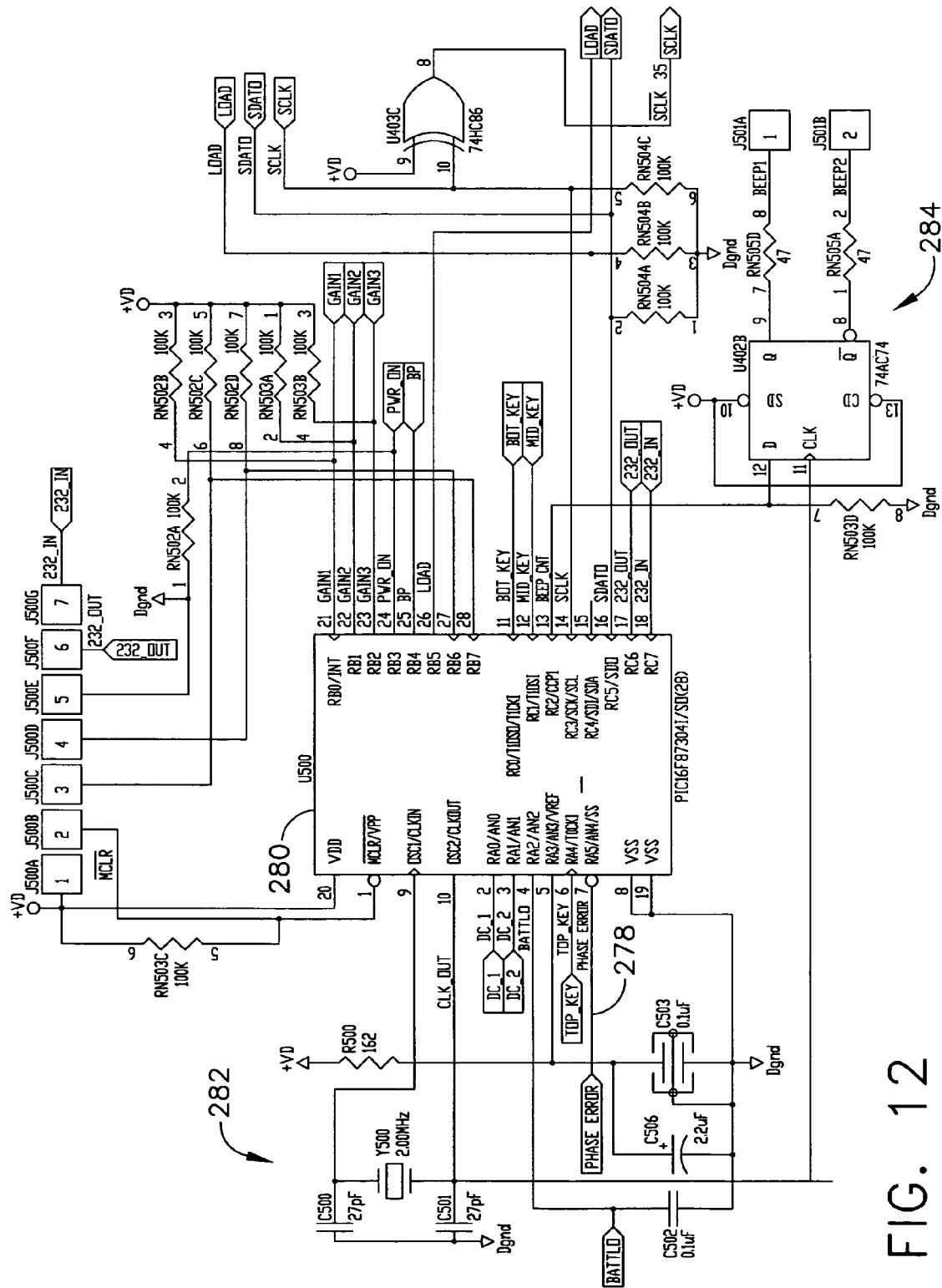

Referring now to FIG. 12, a microprocessor or microcontroller chip 280 is used to not only control the LCD display 30, but also receives many of the control and waveform signals that run throughout the electronic circuit of the detector 10. For example, the output signals from the synchronous rectifiers 240 and 250 are referred to as "DC-1" and "DC-2" for the two channels. These signals are directly fed to the microcontroller 280, which has an on-board analog-to-digital (A/D) converter that can measure the magnitudes of these two input signals. In this manner, the software that executes on the microcontroller 280 will be used to determine the relative strengths (i.e., voltage magnitudes) of these two input signals from channel 1 and channel 2.

Microcontroller 280 also has digital inputs, and these include inputs from the three pushbutton switches on the array of switches 20 on the front panel of the modulated laser detector 10. Microcontroller 280 also controls the "gain" outputs that in turn control the firing gates of the integrated circuits 224 and 234, which respectively control the automatic gain amplifiers 222 and 232 that are illustrated on FIG. 9.

Figure 13:
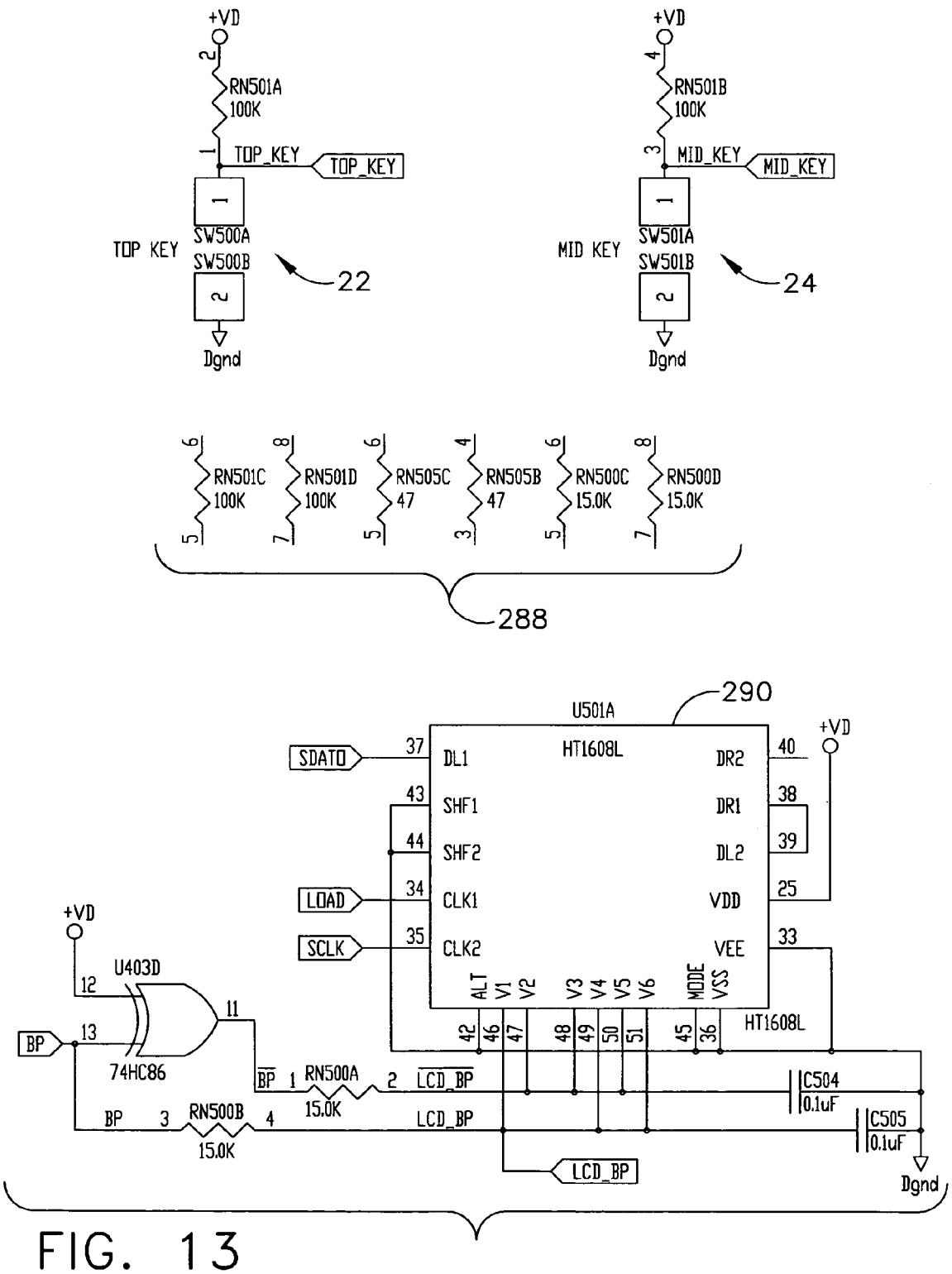
Figure 14:
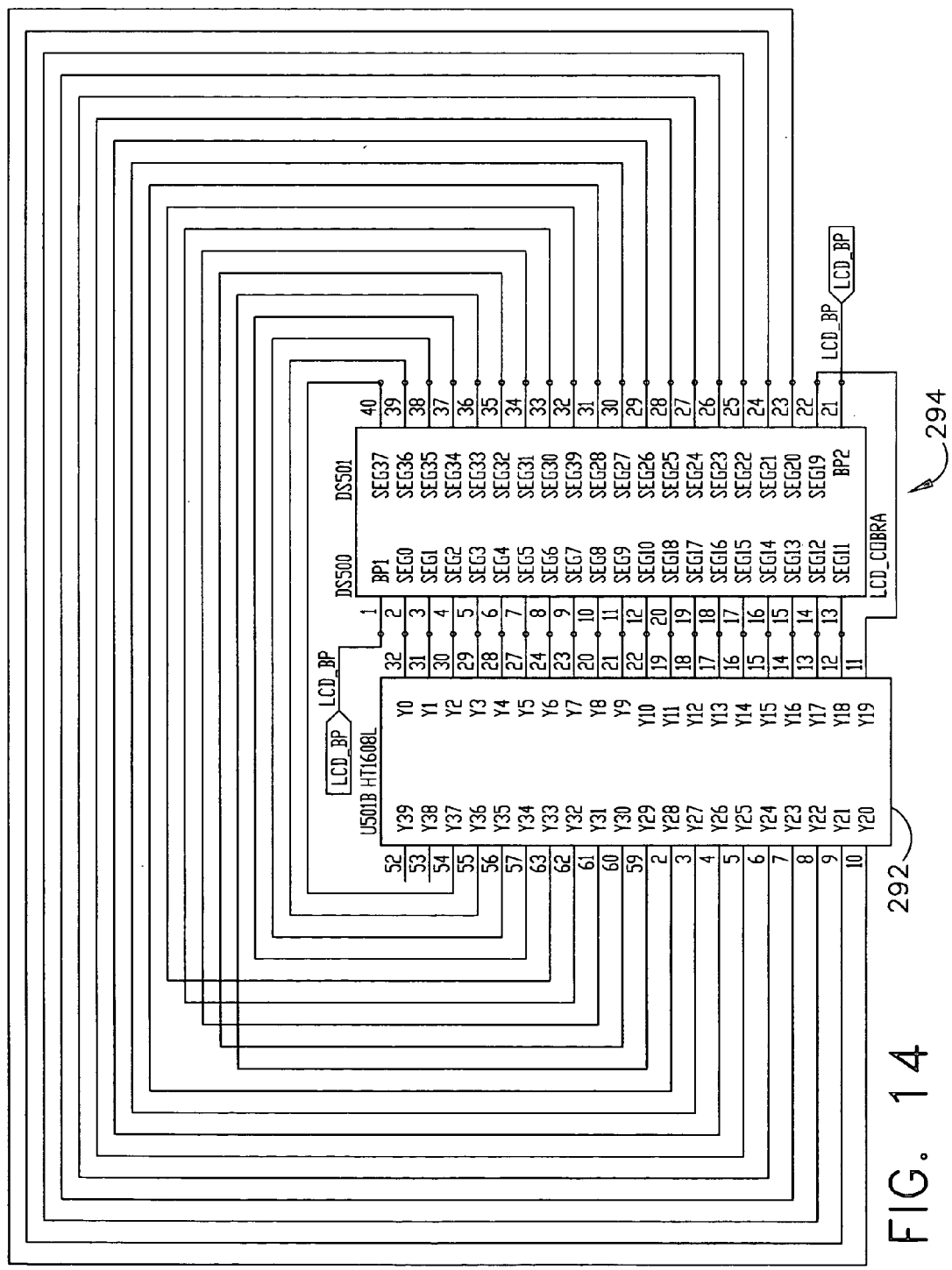

In addition to the above, microcontroller 280 also controls the appearance of the liquid crystal display 294, and it does so by sending control signals to an LCD driver chip, which is an integrated circuit generally designated by the reference numeral 290, as seen on FIG. 13. The liquid crystal display 294 itself is shown schematically on FIG. 14, including the LCD driver chip 292.

Figure 15:
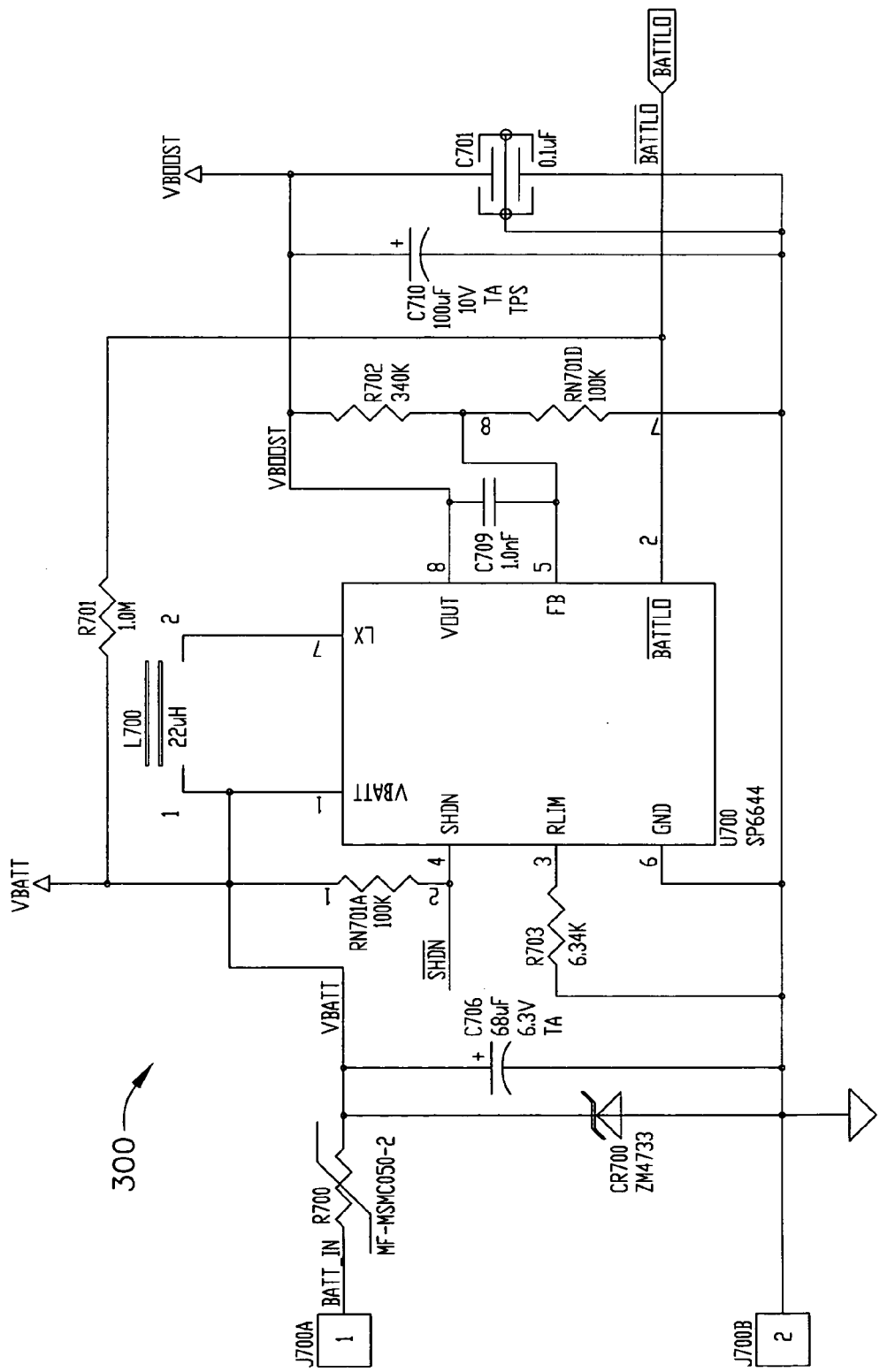
Figure 16:
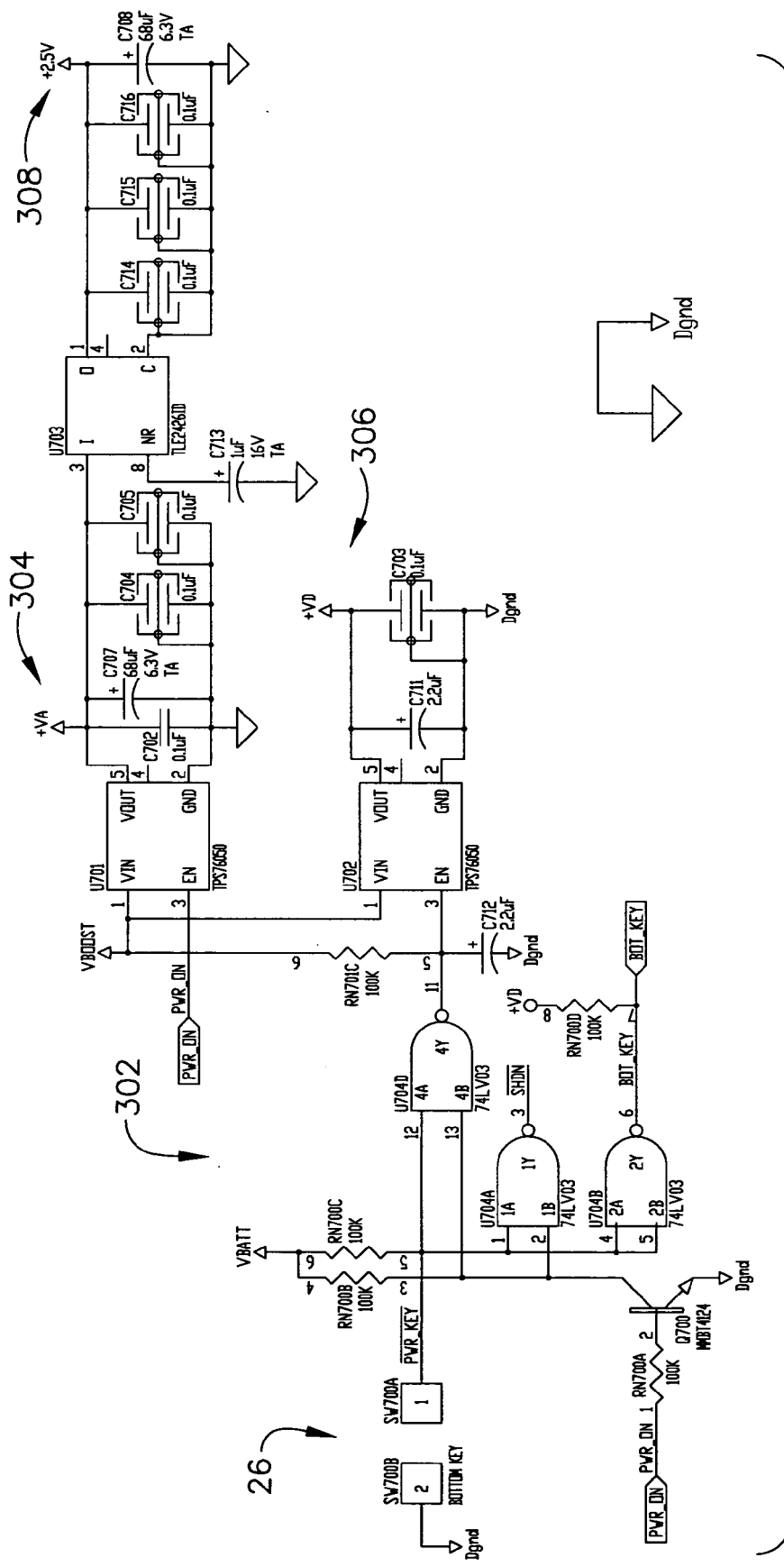

FIG. 15 illustrates some of the power supply circuit components, in which the first portion of the power supply is generally designated by the reference numeral 300. This portion of the power supply 300 boosts the battery voltage from about 3 volts DC up to a regulated value of about +5.5 volts DC. The power supply control circuit is illustrated on FIG. 16, and is generally designated by the reference numeral 302. The boost regulator 300 is designed to continue operating as the batteries begin to run down, even as low as 1 volt (instead of the nominal 3 volts). The power supply control circuit 302 is controlled by the ON-OFF pushbutton key 26, as discussed above. There are multiple voltage regulator integrated circuits as part of the power supply, including regulators that provide an analog voltage source +VA (at reference numeral 304) and also a separate digital power supply rail +VD, as illustrated at the reference numeral 306.

Figure 8:
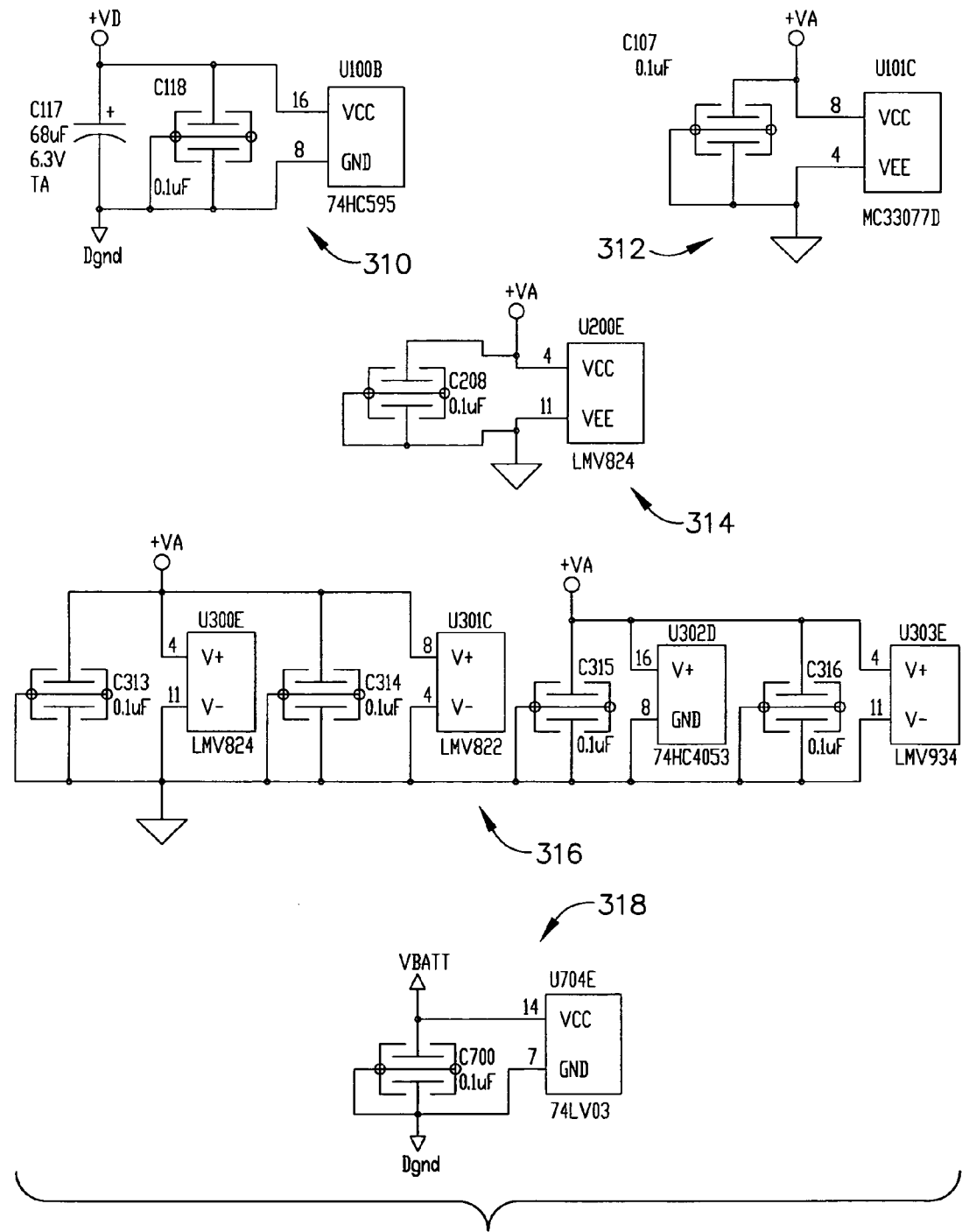
Figure 17:
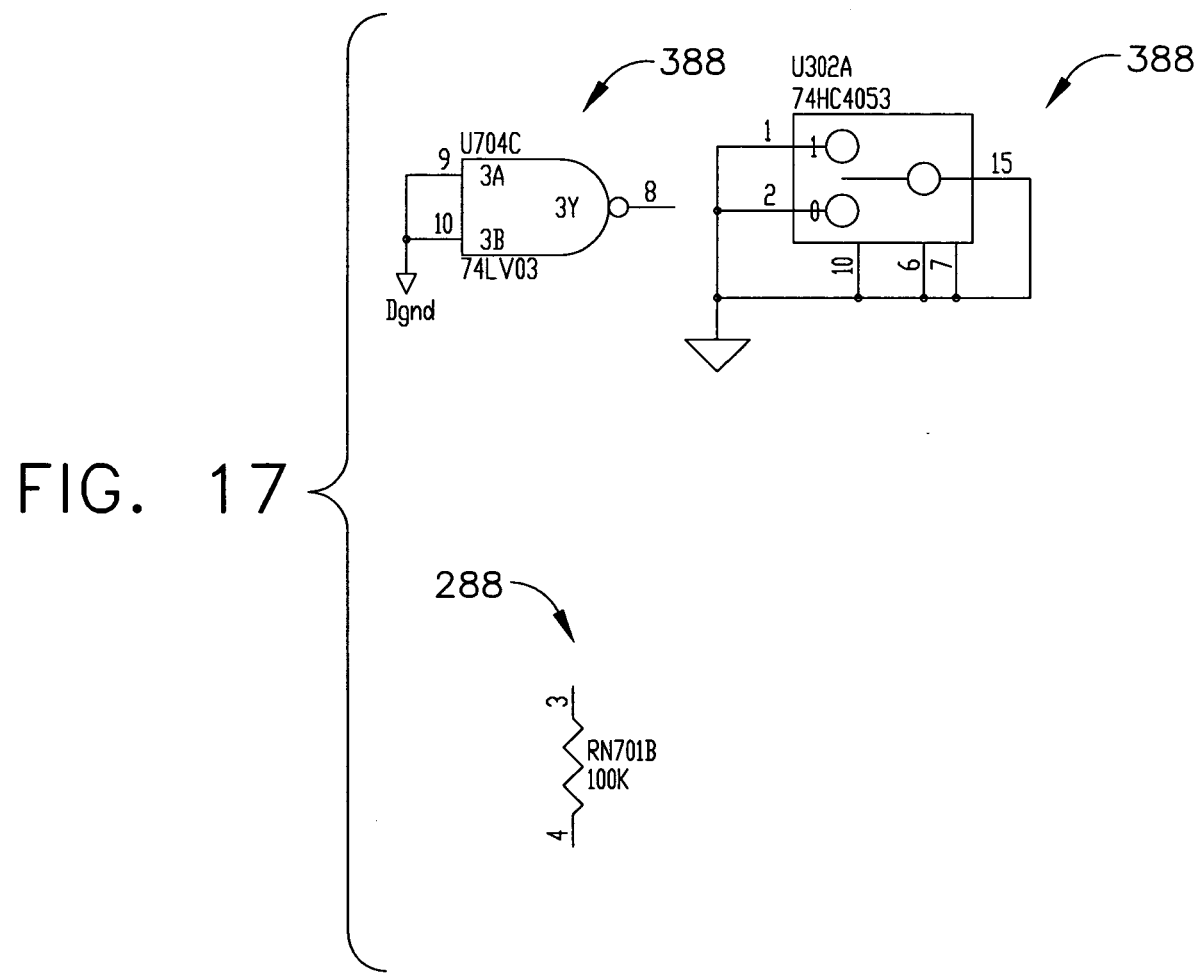

FIG. 8 shows several of the other power supply components, including power supply components 310, 312, 314, 316, and 318. Also on FIGS. 8 and 17, are illustrated a number of unused components 288 or gates 388 that are part of the integrated circuits used in the electronic control circuit of the laser detector 10. Of course, these "extra" components could be available for other functions, if desired.

Figure 18:
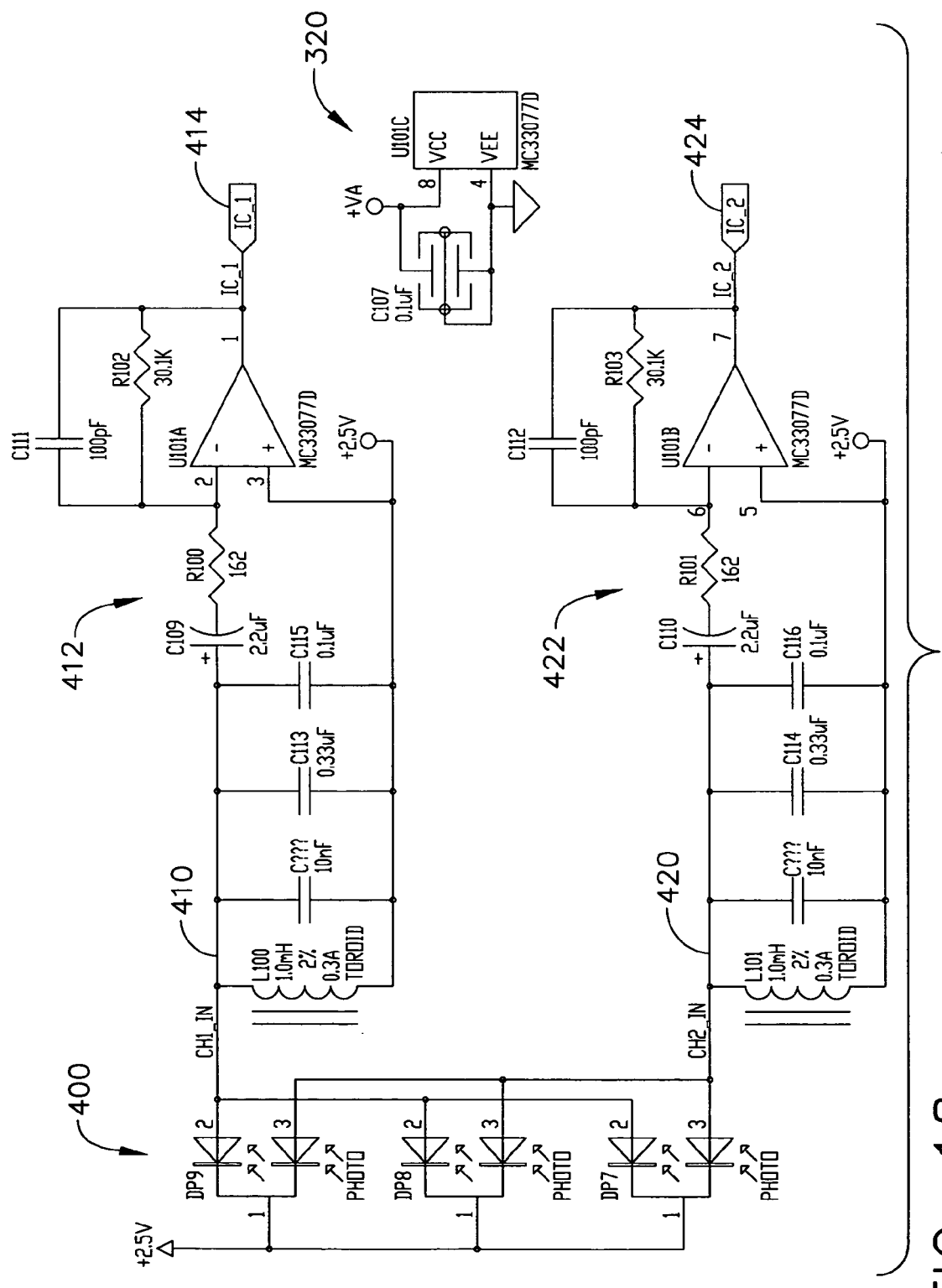
FIG. 18 is an electrical schematic of an alternative embodiment input stage, usable in the present invention, which uses a set of silicon substrates for the photodiodes that electrically form a single split-cell for a proportional modulated beam laser detector, as according to the principles of the present invention.

An alternative embodiment for the input circuit is illustrated as an electrical schematic on FIG. 18. This input circuit is generally designated by the reference numeral 400, and includes a set of photodiodes that comprise a photodetector array, such as the array 150 illustrated on FIG. 2. The photodetector array 400 operates as a proportional modulated beam detector front-end, and electrically will look like three silicon substrates that form a single optical split-cell. The output voltages are at 410 and 420, which are respectively referred to on FIG. 18 as CH_1-IN and CH_2-IN. After running through a band pass filter (either 412 or 422), these channel 1 and channel 2 signals 414 and 424 become the familiar IC_1 and IC_2 signals that were seen on FIGS. 7 and 9 which are output from the low noise amplifiers 216 and 218. Once signals 414 and 424 reach this point on the schematic diagram of FIG. 18, they are passed on to circuit components that have been described above, such as the band pass filters with gain amplifiers 220 and 230, respectively.

It will be understood that the logical operations involving the automatic gain control circuits 222 and 232, the level detection functions, and the phase error detection functions that are performed by the microcontroller 280 could be implemented using sequential logic (e.g., using microprocessor or microcomputer technology), or using a logic state machine, or perhaps by discrete logic alone; it could also be implemented using parallel processors. One possible embodiment may use a microprocessor or microcontroller to execute software instructions that are stored in memory cells within an ASIC (an Application Specific Integrated Circuit). In fact, the entire microcontroller 280, along with dynamic RAM and executable ROM, may be contained within a single ASIC, in one mode of the present invention. Of course, other types of circuitry could be used to implement the logical operations and analog circuit functions depicted in the drawings without departing from the principles of the present invention.

It will be further understood that the precise circuits depicted in the schematic diagrams of FIGS. 6–18, and discussed above, could be modified to perform similar, although not exact, functions and mathematical operations without departing from the principles of the present invention. The exact nature of some of the circuit elements and logical operations of these circuit elements in FIGS. 6–18 are directed toward specific future models of modulated laser light detectors (those involving Apache Technologies, Inc. laser detectors, for example) and certainly similar, but somewhat different, steps would be taken for use with other types of laser detectors in many instances, with the overall inventive results being the same.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

The invention claimed is:

1. A modulated laser light detector, comprising:
   (a) at least one laser light photosensor, which generates at least one first electrical signal when receiving modulated laser light energy having at least one predetermined range of wavelengths and at least one predetermined range of modulation frequencies;
   (b) at least one amplifier stage that receives said at least one first electrical signal and outputs at least one second electrical signal having a first waveform that exhibits voltage components of both positive-going and negative-going regions;
   (c) a phase and frequency detector that receives said at least one second electrical signal and generates a lock signal that corresponds to a zero crossing of said first waveform;
   (d) at least one synchronous rectifier stage that receives said lock signal and receives said at least one second electrical signal, and generates at least one third electrical signal of a second waveform that comprises a substantially rectified version of said first waveform;
   (e) at least one low pass filter that receives said at least one said third electrical signal and outputs at least one fourth electrical signal that comprises a substantially DC voltage; and
   (f) at least one signal strength detector that inspects the substantially DC voltage of said at least one fourth electrical signal, and determines a relative strength of said received modulated laser light energy.

2. The modulated laser light detector as recited in claim 1, further comprising: at least one automatic gain control circuit that is in electrical communication with said at least one amplifier stage;
   wherein said at least one signal strength detector comprises a processing circuit and an associated memory circuit having a plurality of memory elements which contain computer executable software.

3. The modulated laser light detector as recited in claim 2, wherein said processing circuit is configured:
   (i) to control said at least one automatic gain control circuit for at least two channels of said at least one amplifier stage, a first of said channels corresponding to a first input channel of said at least one first electrical signal, and a second of said channels corresponding to a second input channel of said at least one first electrical signal;
   (ii) to determine a first signal strength for a first channel of said at least one fourth electrical signal;
   (iii) to determine a second signal strength for a second channel of said at least one fourth electrical signal; and
   (iv) to compare said first signal strength and said second signal strength, thereby determining a relative position of said received modulated laser light energy impacting on said at least one laser light photosensor.

4. The modulated laser light detector as recited in claim 3, wherein said at least one laser light photosensor comprises a plurality of photocells, in which each of said plurality of photocells outputs one of said at least one first electrical signal; and further comprising:
   (a) a plurality of analog switches that, under the control of said processing circuit, connect each of said plurality of photocells to one of: (i) a channel 1 signal and (ii) a channel 2 signal, wherein said channel 1 signal and said channel 2 signal are indicative of said relative position of said received modulated laser light energy impacting on said at least one laser light photosensor.

5. The modulated laser light detector as recited in claim 1, further comprising: an analog summing stage that receives a first channel of said at least one second electrical signal and receives a second channel of said at least one second electrical signal, and outputs a summed electrical signal; and
   wherein said summed electrical signal is connected as an input to said phase and frequency detector, and is used for generating said lock signal.

6. An electronic circuit, comprising:
   (a) a first amplifier stage that outputs a first electrical signal having a first waveform that exhibits voltage components of both positive-going and negative-going regions;
   (b) a phase and frequency detector that receives said first electrical signal and generates a lock signal that corresponds to a zero crossing of said first waveform;
   (c) a first synchronous rectifier stage that receives said first electrical signal and generates a second electrical signal of a second waveform, in which said second waveform substantially comprises a rectified version of said first waveform and exhibits a voltage component having substantially only a single one of a positive-going and a negative-going region;
   (d) a first low pass filter that receives said second electrical signal and outputs a third electrical signal that comprises a substantially DC voltage; and
   (e) a laser light photosensor, which generates a fourth electrical signal when receiving modulated laser light energy having at least one predetermined range of wavelengths and at least one predetermined range of modulation frequencies.

7. The electronic circuit as recited in claim 6, further comprising: an automatic gain control circuit that is in electrical communication with said first amplifier stage.

8. The electronic circuit as recited in claim 6, wherein: (i) said fourth electrical signal is input to said first amplifier stage that outputs said first electrical signal; and (ii) said substantially DC voltage of the third electrical signal exhibits a predetermined magnitude for a particular signal strength of said received modulated laser light energy.

9. The electronic circuit as recited in claim 8, further comprising: a first signal strength detector that inspects the substantially DC voltage of said third electrical signal and determines a relative strength of said received modulated laser light energy.

10. The electronic circuit as recited in claim 9, wherein said laser light photosensor comprises a plurality of photocells, in which each of said plurality of photocells outputs a channel of said fourth electrical signal.

11. The electronic circuit as recited in claim 10, further comprising:
    (a) a processing circuit and an associated memory circuit having a plurality of memory elements which contain computer executable software; and
    (b) a plurality of analog switches that, under the control of said processing circuit, connect each of said plurality of photocells to one of: (i) a channel 1 signal and (ii) a channel 2 signal, wherein said channel 1 signal and said channel 2 signal are indicative of said relative position of said received modulated laser light energy impacting on said at least one laser light photo sensor;
    wherein said processing circuit is configured to perform the functions of said first signal strength detector.

12. The electronic circuit as recited in claim 11, further comprising: a first automatic gain control circuit that is in electrical communication with said first amplifier stage, and a second automatic gain control circuit that is in electrical communication with a second amplifier stage;
    wherein: said channel 1 signal is input to said first amplifier stage with said first automatic gain control circuit, said channel 2 signal is input to said second amplifier stage with said second automatic gain control circuit, and said first electrical signal exhibits two output channels; and
    wherein said processing circuit is configured to control said first and second automatic gain control circuits.

13. The electronic circuit as recited in claim 12, further comprising: a second synchronous rectifier stage which outputs a second channel of said second electrical signal, a second low pass filter which outputs a second channel of said third electrical signal, and a second signal strength detector that inspects the substantially DC voltage of the second channel of said third electrical signal and determines a relative strength of said received modulated laser light energy for said second channel.

14. The electronic circuit as recited in claim 13, wherein said processing circuit is configured:
    (i) to determine a first signal strength for said first channel of said third electrical signal;
    (ii) to determine a second signal strength for said second channel of said third electrical signal; and
    (iii) to compare said first signal strength and said second signal strength, thereby determining a relative position of said received modulated laser light energy impacting on said laser light photosensor.

15. The modulated laser light detector as recited in claim 14, further comprising: an analog summing stage that receives the first channel of said third electrical signal and receives the second channel of said third electrical signal, and outputs a summed electrical signal; and
    wherein said summed electrical signal is connected as an input to said phase and frequency detector, and is used for generating said lock signal.

* * * * *